United States Patent [19]
Hamel et al.

[11] 3,987,309
[45] Oct. 19, 1976

[54] SUPERCONDUCTIVE SENSING CIRCUIT FOR PROVIDING IMPROVED SIGNAL-TO-NOISE

[75] Inventors: Harvey C. Hamel; Kenneth D. Terlep, both of Poughkeepsie, N.Y.

[73] Assignee: International Business Machines Corporation, Armonk, N.Y.

[22] Filed: Dec. 23, 1974

[21] Appl. No.: 535,253

[52] U.S. Cl. .............................. 307/212; 307/245; 307/277; 307/306; 357/5
[51] Int. Cl.² ........................................ H03K 19/195
[58] Field of Search .......... 307/212, 277, 306, 245; 357/5

[56] References Cited
UNITED STATES PATENTS

| | | | |
|---|---|---|---|
| 3,843,895 | 10/1974 | Hamel et al. | 307/306 X |
| 3,886,382 | 5/1975 | Cain | 357/5 |

*Primary Examiner*—John Zazworsky
*Attorney, Agent, or Firm*—Harold H. Sweeney, Jr.

[57] ABSTRACT

A superconductive sensing circuit having improved signal-to-noise ratio is provided for use with logic circuits using logic switching devices. The sensing circuit includes a first and second branch in parallel wherein the first branch includes a Josephson switching device. The first branch also includes a first inductance and the second branch includes an inductance greater than or equal to the first inductance. The Josephson device in the first branch of the sensing circuit is biased to switch into it's finite voltage state so that the gate current from the logic circuit is directed to the second sensing branch. The Josephson device in the first branch automatically resets to it's no voltage state so that subsequent input current is divided between the two branches inversely proportional to the inductances therein. This subsequent current in the first branch of the sensing circuit is sensed and is indicative of the switching of one or more of the logic devices in the logic circuit.

10 Claims, 7 Drawing Figures

SUPERCONDUCTIVE SENSING CIRCUIT FOR PROVIDING IMPROVED SIGNAL-TO-NOISE

BRIEF STATEMENT OF THE INVENTION

This invention relates to a superconductive sensing circuit for use with logic circuits, and more particularly to a superconductive sensing circuit which utilizes a Josephson switching device to provide a signal output having an improved signal-to-noise ratio.

BACKGROUND OF THE INVENTION

The output of logic circuits utilizing Josephson devices is usually a small current developed as a result of the switching of one or more of the Josephson devices. This current or absence of the current designates a logic 1 or 0, respectively. The detection of this small current is often difficult because of the current that already exists in the logic line, such as gate current, from which the small current change must be distinguished. This existing current can be considered as noise and thus the signal-to-noise ratio is small.

Josephson devices are superconductive devices where superconductivity means the complete disappearance of the electrical resistivity of a number of metals and alloys at very low temperatures near absolute zero. Superconductivity occurs suddenly below a certain temperature. This so called critical temperature differs from material to material. It is known that electrons may be driven across a potential barrier between two conductors separated by a thin, non-conducting layer. The barrier is crossed by tunnelling. Hence, the effect is called "the tunnelling effect". When the conductors are superconductive, single electrons may tunnel through such areas, whereby they overcome a potential difference corresponding to the value of the gap voltage. However, besides this single electron tunnelling effect there exists a further superconductive tunnelling effect involving bound electron pairs. In a superconductive metal, the prevailing charge carriers involved are electron pairs coupled with the lattice by the electron phonon interaction. Such electron pairs are called "Cooper pairs" after the scientist of that name. It has been predicted by B. D. Josephson, that a tunnelling effect involving Cooper pairs as carriers should occur between two adjacent superconductive metals separated by a sufficiently thin insulating layer. The insulating layer of material behaves like a superconductive metal in this Josephson tunnelling effect. With this kind of tunnelling, no potential difference is passed and, accordingly, no resistance is encountered by the current. The basic paper covering the Josephson tunnelling effect is the "Possible New Effects In Superconductive Tunnelling," published by B. D. Josephson in issue No. 7, Vol. No. 1 of the periodic Physic Letters, dated July 1, 1962 on pages 251 through 253. Generally the Josephson element or junction consists of a thin oxide barrier layer between two superconductive leads. At least one control line is provided for controlling the switching behavior of the element. The superconductive Josephson elements operate at a temperature of a few degrees kelvin and can take two different states depending on the passing current. In the region below the maximum Josephson current Imax, a Cooper pair tunnelling current is flowing. This is called "pair tunnelling," and the voltage drop across the element is zero. The element is in the superconductive state. When the current value Imax is exceeded the element switches to the other state, the finite voltage state. The current obtained is a tunnelling current which, however, involves essentially single charge carriers or quasi-particles. The particle tunnelling process is accompanied by a voltage drop caused by the tunnelling current, which voltage drop corresponds to the energy gap voltage Vg.

In the so-called finite voltage state of a Josephson element, the leads remain in the superconducting state, and a particle tunnelling current flows across the isolating interface. In Josephson elements a very small voltage drop occurs, which results in very little heat dissipation. When the current is reduced or removed after switching into the finite voltage state, a hysteresis effect occurs, i.e. resetting by changing to the superconducting state occurs at a current value considerably below the value Imax. The maximum Josephson current value Imax can be influenced by controlling magnetic fields applied by the current passing through the adjacent control lines. The maximum Josephson current value at which switching from the no voltage or superconducting state to the finite voltage state occurs can be varied by the design of the Josephson device.

Since Josephson elements can take two distinguishable states, they can be utilized in binary circuits. In U.S. Pat. No. 3,281,609, a superconductive switching element utilizing tunnelling effects is described. Input currents to be connected are applied through a Josephson junction. If the current flowing through the Josephson junction overcomes the maximum Josephson value, the junction switches to the finite voltage state. The resulting output current flows through a load resistance connected in parallel to the Josephson junction. U.S. Pat. No. 3,626,391 is an example of the application of Josephson elements to a memory application. The binary values are represented by the direction of circulating current in superconducting loops. Switching the current direction and sensing the storage value is effected by Josephson elements.

A paper by J. Matisoo, "The Tunnelling Cryotron — A Superconductive Logic Element Based on Electron Tunnelling" appears in the February 1967 issue of the Proceedings of the IEEE, issue No. 2, Vol. 55. This paper describes an application of Josephson elements as logic gates. It is concerned essentially with the switching behavior of a single element. It is suggested in one of the figures, that the current distribution in two branches of a superconducting loop can be controlled.

In U.S. Pat. No. 3,758,795 a binary logic circuit has been disclosed which utilizes Josephson elements, whereby, a line terminated by its characteristic impedance is connected in parallel to a Josephson junction. In the superconducting state, the current flows essentially through the Josephson junction, but in the normal conducting state it flows through the parallel line. Subsequent elements can be controlled by the current in the line. These superconductive circuits are sensing whether the gate current is present or not. They are not concerned with a current change in addition to or subsequent with respect to the gate current.

Even with the knowledge of these superconductive Josephson tunnelling effects and their application to logic circuits and switching devices, it was not readily apparent how the Josephson tunnelling effect could be applied to reliable sensing circuits, especially one that can provide sensing with a high signal-to-noise ratio even though the signal must be detected in the presence of the Josephson gating signal.

Accordingly, it is the main object of the present invention to provide a sensing circuit for use in logic circuits utilizing superconductive Josephson tunnelling devices to provide a sensing signal having an improved signal-to-noise ratio.

It is another object of the present invention to provide a sensing circuit which isolates the current to be detected from the so called noise current so that the current to be detected has a theoretical infinite signal-to-noise ratio.

It is a further object of the present invention to provide a sensing circuit which utilizes a superconductive Josephson tunnelling device as the main element thereof.

BRIEF SUMMARY OF THE INVENTION

A superconductive sensing circuit having an improved signal-to-noise ratio is provided for use in logic circuits to detect the switching of one or more logic elements. The sensing circuit includes a first and second branch in parallel wherein the first branch includes a Josephson switching device in series with a first inductance. The second branch includes an inductance larger than or equal to the inductance in said first branch. The Josephson device in the first branch of the sensing circuit is biased to switch into it's finite voltage state so that the gate current from the logic circuit is directed to the second sensing branch. The Josephson device in the first branch automatically resets to it's zero voltage state so that subsequent input current due to the switching of one of the logic devices in the logic circuit is divided between the two branches inversely proportional to the inductances therein. This subsequent current in the first branch of the sensing circuit is detected and is indicative of the switching of one or more of the logic elements in the logic circuit.

BRIEF DESCRIPTION OF THE DRAWINGS

FIG. 2b is a schematic illustration of a 3$\phi$ clock generator for providing the timing for the circuit shown in FIG. 2a.

DETAILED DESCRIPTION OF THE PREFERRED EMBODIMENT

Figure 1:
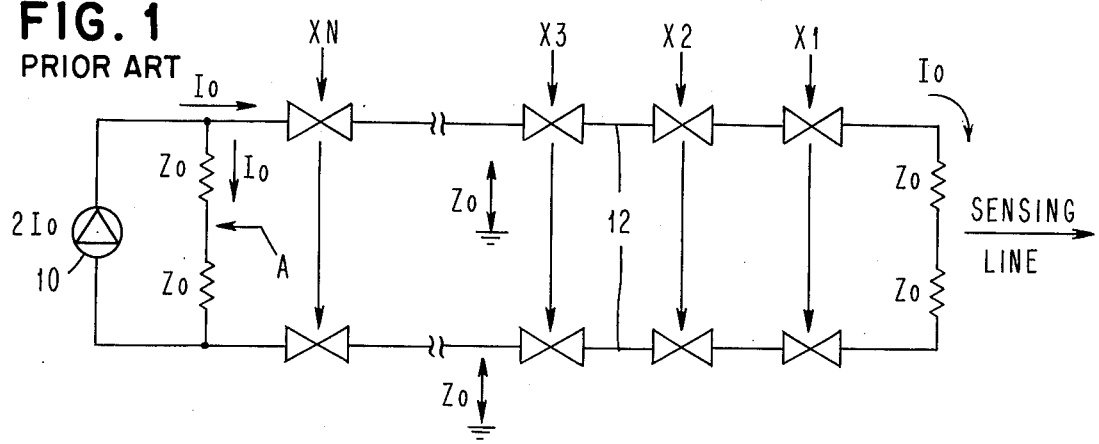
FIG. 1 is a schematic illustration of a prior art multi-OR logic circuit utilizing Josephson devices as logic elements.
Figure 2A:
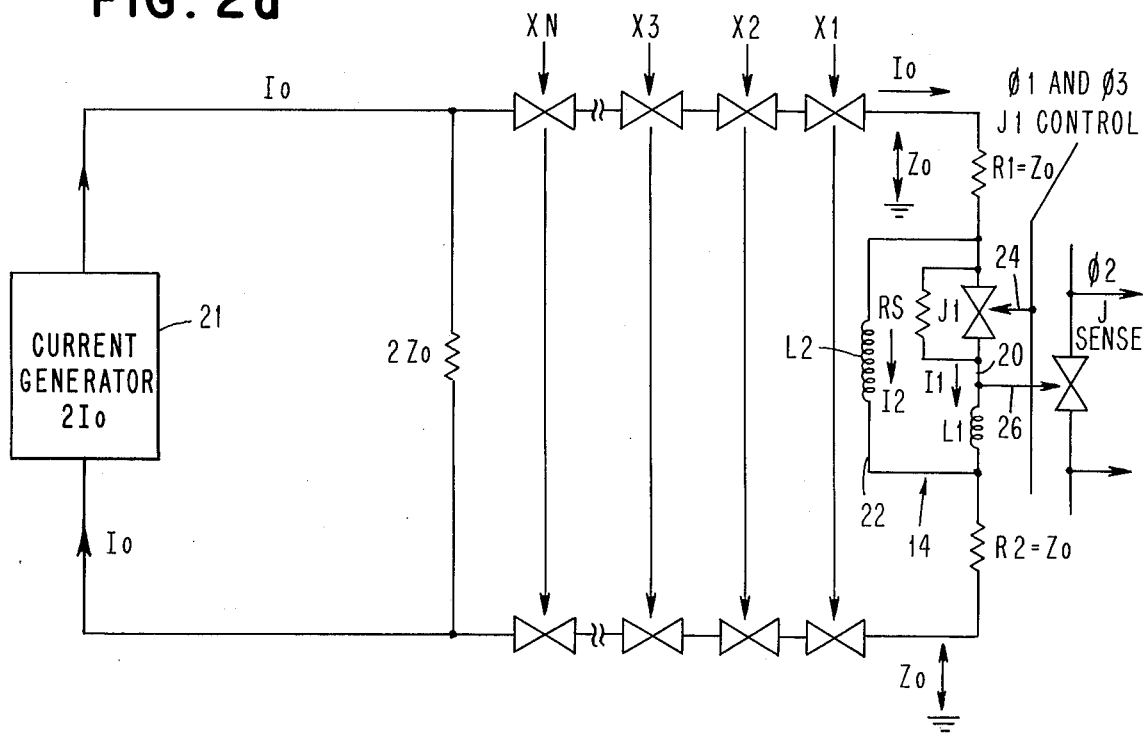
FIG. 2a is a schematic diagram showing a multi-OR logic circuit and the sensing circuit of this invention utilized therewith.
Figure 2B:
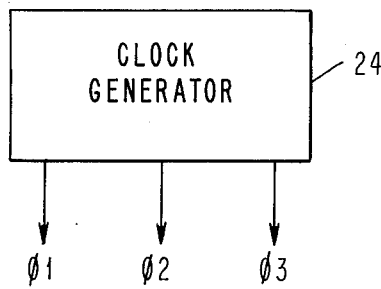

Referring to FIG. 1 there is shown a multi-OR circuit comprised of a string of N gate pairs each of which can be used for sensing the state of an input line in an N input OR circuit. The multi-OR circuit is a symmetrical arrangement wherein a number of Josephson tunnelling devices X1, X2, ... XN are shown located serially in each half of a transmission line 12. A gate current generator 10 produces a gate current $2I_0$ which provides a current $I_0$ in each half of the symetrical transmission line 12 for providing the gate current biasing to each of the Josephson devices X1–XN. Each input line to the Josephson devices is applied to a pair; this is done for "balancing" of the line which is assumed to be physically isolated from the superconducting ground plane. Of course, if ground plane connections are utilized along with terminating resistors of magnitude $Z_0$, the characteristic impedance of the line, then single Josephson tunnelling devices may be used for each input line. The inputs to the Josephson devices X1 ... XN come from other parts of the logic circuit, wherein a one logic input on any one input line causes switching of the pair of devices to their finite voltage state, thereby, decreasing the current in the transmission line 12. It should be appreciated that more than one input containing a logic 1 will cause a corresponding number of Josephson tunnelling device pairs to switch, thereby, providing a corresponding decrease in current on the transmission line. The maximum speed of operation for the transmission line with the N input OR circuits is with proper termination at each end of the loop shown by the resistors $Z_0$. The sensing circuit includes not only the original $I_0$, gating current for the Josephson tunnelling devices, but also must distinguish from this current the additional current change due to the switching of any Josephson device in the chain. The sense circuit of this invention is shown in FIG. 2a as circuit 14. Actually the sense circuit is connected in place of the sense line shown in FIG. 1. The sense circuit could also be connected between the impedances $Z_0$ at the other end of the transmission line identified as point A. The sense circuit at location A would operate based upon the same principle. The only significant difference would be that the current change caused by a switched logic element would be a positive excursion rather than negative as is the case in the sense circuit located at the other end as shown in FIG. 2a.

The insertion of the sense circuit 14 in the overall logic circuit as shown in FIG. 2a does not upset the symmetry of the arrangement since it remains optimally terminated by the two resistors R1 = Z0 and R2 = Z0 shown at either end of the sensing circuit. The branches 20 and 22 of the sense circuit 14 are each of impedance levels so as to optimize the sense circuit's speed and thus that for the total system. The logic circuit requires biasing. This is accomplished by a current generator 21 which provides the bias current $I_o$ to both sides of the transmission line.

The sense circuit 14 includes a Josephson device J1 and an inductance L1 in the first branch 20 thereof. The second branch 22 of the sense circuit 14 includes an inductance L2. These inductances are selected such that L2 is a great deal larger than L1. Accordingly, most of the current entering the sense circuit loop will be in the branch with the smaller inductance L1. A typical design would require L2 = 9L1 such that the branch with inductance L1 would conduct 90 percent of the incoming current, $I_o$. The Josephson device J1 in branch 20 is in it's no voltage state such that the portion of the input current $I_o$ in branch 20 passes therethrough. The device J1 is caused to switch when the control input 24 applies a control current J1 at $\phi 1$ time. It will be appreciated that at 1 time $\beta I_o$, where $$\beta = \frac{L2}{L1 + L2},$$

is also flowing through the junction device J1 providing the necessary bias. The coincidence of the $\beta Io$ bias current in Josephson device J1 and the control current J1 is sufficient to cause the Josephson device J1 to switch to it's finite voltage state. The switching of the Josephson device J1 into it's finite voltage state will cause the portion of the input current Io flowing in branch 20 to flow through the second branch 22 containing inductance L2. By the end of $\phi 1$ clock time Josephson device J1 has reset to its zero voltage state. At $\phi 2$ clock time the inputs to the logic devices X1 . . . XN in the logic loop transmission line are applied and the Josephson devices receiving the logic 1 input switch to their finite voltage state. The switching of one or more of the Josephson devices into it's finite voltage state introduces a voltage into the transmission line which causes a corresponding current variation flowing both ways but of opposite polarity on the transmission line. Since the Josephson devices are energized in pairs this will introduce a current flowing on both parts of the transmission line. The current flowing toward the sensing circuit from any switched Josephson device will be negative. By $\phi 2$ time the Josephson device J1 has automatically reset to it's zero voltage state. This automatic resetting will be described in connection with FIG. 5. The so called subsequent current generated by the switching of one or more of the Josephson devices X1 . . . XN in the transmission line enters the sense circuit and flows through the branches in amounts having an inverse proportion to the inductances L1 and L2. The current flowing through branch 20 is sensed by a further Josephson device J-sense which is connected to the branch 20 via a control line 26. It should be noted that the input current Io to the sense circuit 14 after being directed to branch 22 by the switching of device J1 remains in the branch 22 when the Josephson device J1 resets to it's zero voltage condition. Accordingly, most of the current variation arriving at sense circuit 14 subsequent to the initial current Io passes through the branch 20 which includes the Josephson device J1. This current I1 flowing through branch 20 is sensed by Josephson device J-sense. The sense circuit has essentially separated the Io current or initial bias current, which can be considered as noise, from the I1 current. Thus, the signal-to-noise ratio is theoretically infinity. Since the application of the logic input to trigger one of the Josephson devices in the transmission line is applied at $\phi 2$ time, the J-sense Josephson device is also energized at $\phi 2$ time with a bias gate current which in conjunction with the control current I1 in branch 20 causes J-sense to switch to it's finite voltage condition indicating the presence of a current I1 which in turn is conditional on one or more of the Josephson logic devices in the transmission line switching. The values of the sense circuit 14 inductances, the Josephson device J1 capacitance and any required shunt resistor Rs used across the Josephson device are designed to critically damp the Josephson device J1 such that I1 goes to approximately 0 and then the loop device J1 resets leaving I2 equal to I0 and I1 approximately equal to 0.

When the logic loop current is brought to zero to reset the logic gates at $\phi 3$ time, a persistent current tends to remain in the sense loop. This sense loop circulating current provides sufficient bias to J1 so that the device switches to it's finite voltage state when a large enough control current is applied on control input 24 thus extinguishing the circulating current. It is also possible to extinguish any residual circulating current automatically; that is without any input on J1 control, by appropriately selecting the gain characteristic for J1 with respect to the initial signal current Io, the current change due to any sense pair switching, and the current change due to removal of the current generator 21. In other words, the residual current due to one or more sense pairs switching will be sufficiently large when added to the current change due to the removal of the current generator so that the resulting current exceeds the switching point Imax of the Josephson device J1. Thus, the device J1 will automatically switch to the finite voltage state, thereby extinguishing the residual current.

In summary, the operation of the circuit begins with the application of Io at $\phi 1$ time developing a current Io in the logic loop. At the same time, J1 under control of a control current at $\phi 1$ time switches to its finite voltage state, thereby transferring all of the current Io in the sense circuit to the second sense circuit branch 22 which has the high inductance. After both the logic loop and sense loop currents settle out data is presented to the logic gates. The switching of any one or more of the Josephson logic devices produces a current change most of which flows through branch 20 of the sensing circuit 14 and which is detected by J-sense. This J-sense Josephson device is biased at $\phi 2$ time to switch when the current I1 is present at the control line 26. During $\phi 3$, Io is removed thus resetting the logic loop gates. The sense loop device, J1 switches when the J1 control is applied thereto at $\phi 3$ time simultaneously with the circulating current remaining in the sense circuit. This, as previously mentioned, reduces the circulating sense loop currents to zero.

If $m$ device pairs X1 . . . Xn switch when data becomes available, the total current change in the logic loop is given by:

$$\Delta I \cong \frac{m(2\ V_{gap})}{R\ Total} \approx \frac{m(5.0\ mV)}{4 Z_o}$$

As an example, if $m = 1$ (worse case for examination of discrimination) and $Z_o = 1$ ohm, $\Delta I \approx 1.25$mA. This value of current change represents the minimum logical 1 for sensing. A current change of 1.25mA would split in inverse proportion to the value of inductances of the sense loop branches. If we assume L2=9L1, then I1 $\approx$ 1.12mA with initial value of I$min$. If for example I$min$ of the sense loop is 0.1mA, then:

$$\frac{\Delta I1}{I1\ Initial} \approx \Delta I \frac{L2}{\frac{L1+L2}{Imin}} \approx 11.2$$

or the signal-to-noise ratio is 11.2 for the control current I1 to the sense device, J-sense.

If the sense circuit 14 of this invention were not used and the logic loop current was detected, the steady state current would be Io with a $\Delta I$ as described above for a single pair of devices switching. The maximum $\Delta I$ cannot be greater than Io so that the signal-to-noise value is $\Delta I/Io \leq 1.0$.

It should be appreciated that as the geometries of the devices and circuits become smaller the impedance levels become correspondingly larger, and the magnitude of $\Delta I$ (change of current) for a single pair of devices switching becomes less appreciable in comparison to Io thus decreasing the signal-to-noise.

The invention provides a sense circuit for use with a high speed, many input logic circuit such as an OR circuit. The circuit provides a large signal-to-noise discrimination, is fast when used with large transmission systems, and is particularly attractive when used for array logic applications which require OR circuits with very large fan-in (multi-inputs).

Figure 3:
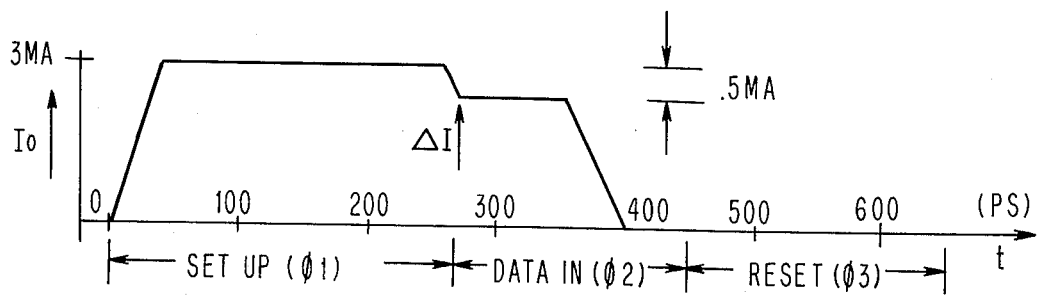
FIG. 3 is a waveform showing the 3$\phi$ operation of the sensing circuit in graphical form.
Figure 4:
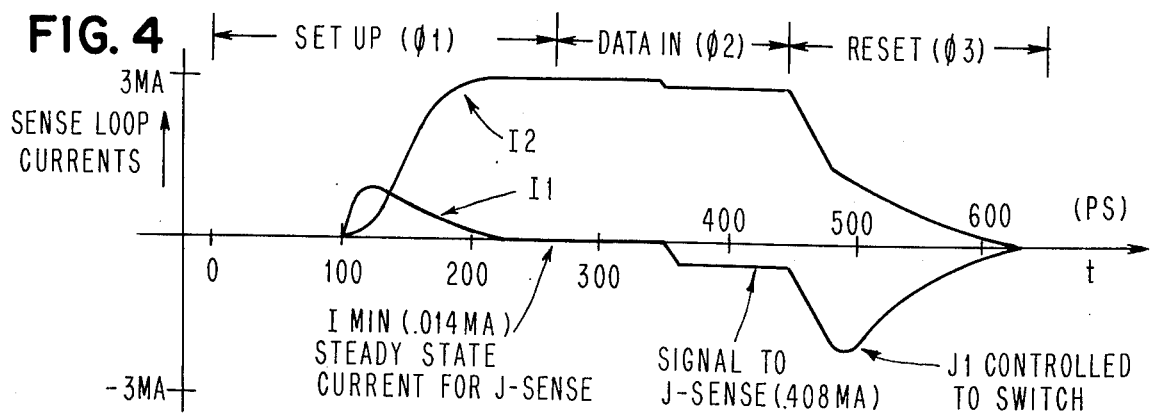
FIG. 4 is a waveform showing the currents developed in the respective branches of a typical sense circuit.

FIG. 3 shows a typical waveform for a multi-OR circuit in which one Josephson device switches providing a 0.5ma (milliampere) current change with an input gate current bias of approximately 3ma. As can be seen, the waveform is broken up into three phases, the setup $\phi 1$, the data in $\phi 2$, and the reset period $\phi 3$. The current change is shown as $\Delta I$. It should be appreciated that this 0.5ma current change $\Delta I$ must be detected in the presence of the Io gate current bias of approximately 2.50 ma. Similarly, FIG. 4 shows a typical waveform for the current I1 and I2 in a sense circuit of the type described above when used with a multi-OR logic circuit having one pair switching to produce a 0.5ma change in current as depicted in FIG. 3. As can be seen, during $\phi 1$ time the sense loop current I2 goes to a maximum of nearly three milliamps while the I1 current in the first branch goes to approximately Imin (0.014 ma). This is caused by the switching and subsequent resetting of the J1 Josephson device. The I2 current curve remains practically unchanged for the current change $\Delta I$ due to one of the logic devices switching. During the reset time, current I2 remaining as a circulating current is extinguished by the switching of Josephson device J1 during $\phi 3$ time. The I1 curve of approximately zero current in branch 20 of the sensing circuit shows a change in current of approximately 0.408 ma as a result of the change in current due to the switching of one of the logic devices. This change is noted during $\phi 2$ time. Similarly during the reset $\phi 3$ time the effect of switching J1 is shown to extinguish the circulating current. It should be noted that the waveform depicting current I1 has to detect the current of 0.408 ma which is slightly less than the 0.5 ma detected in connection with the waveform of FIG. 3, however, this 0.408 ma is detected without the interference or noise of the Io signal. Thus the signal-to-noise ratio is theoretically increased to infinity when Imin is actually zero. In the example above the signal-to-noise ratio is $$\frac{.408}{.014} \approx 29.$$

Figure 5:
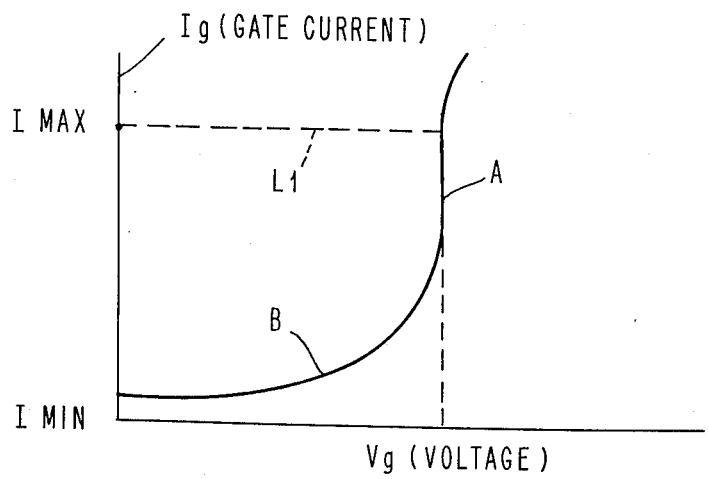
FIG. 5 is a graph depicting the plot of gate current $I_g$ versus gate voltage $V_g$.

FIG. 5 shows the plot of Josephson junction current Ig through a Josephson tunnel junction J1, plotted as a function of the voltage Vg across junction J1. This plot shows the conventional curve denoting pair tunnelling through the junction in the zero voltage state and single particle tunnelling through the junction in the finite voltage state. That is, currents up to a magnitude of Imax will flow through the junction in it's zero voltage state. When current Ig through the junction exceeds this Imax value, the junction will rapidly switch to a finite voltage state at which time the voltages cross the junction will be the band gap voltage Vg. When current through the junction is decreased to a value less than Imax, the voltage across the junction will follow the curve indicated by portions A and B back to Imin and the zero voltage state. Assume that J1 is in it's zero voltage state and a current Ig less than Imax flows through device J1. If a sufficient magnetic field now intercepts J1 such that the critical current Imax fails to a value less than Ig, tunnel device J1 will immediately switch to a finite voltage state.

Figure 6:
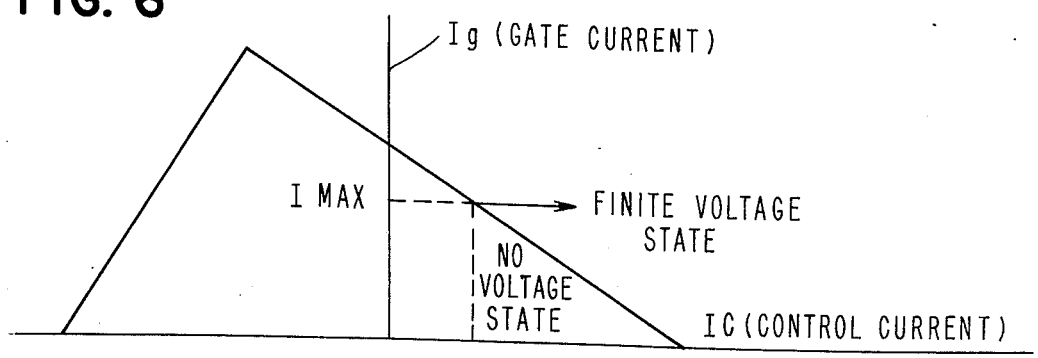
FIG. 6 is a graph depicting the plot of gate current $I_g$ versus control current $I_c$.

FIG. 6 shows the gain curve for a typical Josephson device. This curve is an asymmetric gain curve obtained by plotting current Ig through the Josephson device as a function of control current Ic used to create a magnetic field intercepting the device. The control current Ic can be directed with respect to the Josephson device to create magnetic fields in a direction which either add to the self-magnetic field produced by the device or that are opposed to the self-magnetic field. It should be noted that the region within the gain curve of FIG. 6 corresponds to the zero voltage state while the region outside the gain curve corresponds to the finite voltage state of the Josephson device.

While the invention has been particularly shown and described with reference to the embodiment thereof, it will be understood by those skilled in the art that the foregoing and other changes in form and detail may be made therein without departing from the spirit and scope of the invention.

What is claimed is:

1. A superconductive sensing circuit providing improved signal-to-noise ratio comprising:
    a logic circuit including a plurality of superconductive logic devices;
    a sensing circuit connected to detect current changes in said logic circuit;
    a first and second sensing circuit branch connected in parallel included in said sensing circuit;
    a Josephson tunnelling device having a finite voltage and a no voltage state located in said first branch;
    a first inductance located in said first branch;
    a second inductance located in said second branch, said second inductance being equal to or larger than said first inductance;
    means for applying gate current bias to said logic devices and to said Josephson device;
    control means for switching said Josephson device into it's finite voltage state when said gate current bias is applied thereto causing the gate current to switch to the said second branch;
    said Josephson device automatically resetting to it's no-voltage state;
    means for sensing any subsequent current changes in said first branch due to the switching of one or more logic devices in said logic circuit;
    means for extinguishing circulating currents in said sensing circuit formed by said first and second branches subsequent to the operation of said means for sensing subsequent current changes.

2. A sensing circuit according to claim 1, wherein said logic circuit is a multi-OR circuit which uses Josephson switching devices as said logic devices arranged in series in a transmission line.

3. A sensing circuit according to claim 1, wherein a three phase clock source is provided for generating a first clock time in which gating current and a control pulse are applied to said Josephson device located in said first branch of said sense circuit, said means for sensing subsequent current change being energized during $\phi 2$ time, said bias to said logic circuit and said Josephson device in the first branch of the sensing circuit being applied during said second phase time, said gate current being removed during $\phi 3$ time and a control pulse being applied to said Josephson device in said first branch of said sensing circuit to switch said device and extinguish the circulating current.

4. A sensing circuit according to claim 1, wherein said means for sensing any subsequent current changes comprises a sensing Josephson device having a control means connected to the first branch of said sensing circuit to thereby utilize the subsequent current in said first branch as a control means for said sensing Josephson device, gate current being applied to said means for sensing any subsequent current changes at said $\phi 2$ time, the simultaneous application of the gate current and a sufficient control current producing switching of the sensing Josephson device.

5. A sensing circuit according to claim 1, wherein the Josephson device located in said first branch of said sensing circuit has a control pulse applied thereto at $\phi 3$ time of sufficient amplitude in conjunction with the residual circulating current to switch said Josephson device and thereby extinguish said current, said sensing circuit thereby being ready for a further logic sensing operation.

6. A sensing circuit according to claim 1, wherein said first inductance in said first branch of said sensing circuit is equal to or smaller than the inductance located in the second branch of said sensing circuit, thereby causing the subsequent current entering the sensing circuit to divide into said branch circuits of said sensing circuit inversely in proportion to the inductances located therein.

7. A sensing circuit according to claim 1 wherein said Josephson device located in said first branch of said sensing circuit has sufficient capacitance so that the shunt resistance and the sensing circuit inductance will critically damp the Josephson device such that the Josephson device will automatically reset to it's no-voltage state.

8. A superconductive sensing circuit in accordance with claim 1, wherein said logic circuit logic devices are arranged in pairs to provide a balanced transmission line.

9. A superconductive sensing circuit in accordance with claim 8, wherein said sensing circuit is connected to said logic circuit through resistors, one located at each end of said sensing circuit, each resistor having a value equal to the characteristic impedance of the part of the transmission line to which it is connected.

10. A sensing circuit according to claim 1, wherein said means for extinguishing circulating currents comprises the automatic switching of said Josephson device into its finite voltage state in response to the additive currents caused in said device by the switching of any one or more of said logic devices followed by the removal of the gate current, the resulting current being greater than the Josephson device critical current value for switching.

* * * * *